United States Patent
Lin et al.

(10) Patent No.: US 9,960,902 B1
(45) Date of Patent: May 1, 2018

(54) TEMPORAL CHANGE IN DATA-CROSSING CLOCK PHASE DIFFERENCE TO RESOLVE META-STABILITY IN A CLOCK AND DATA RECOVERY CIRCUIT

(71) Applicant: Xilinx, Inc., San Jose, CA (US)

(72) Inventors: Winson Lin, Daly City, CA (US); Yu Xu, Palo Alto, CA (US); Caleb S. Leung, San Jose, CA (US); Alan C. Wong, San Jose, CA (US); Christopher J. Borrelli, Los Gatos, CA (US); Yohan Frans, Palo Alto, CA (US); Kun-Yung Chang, Los Altos Hills, CA (US)

(73) Assignee: XILINX, INC., San Jose, CA (US)

( * ) Notice: Subject to any disclaimer, the term of this patent is extended or adjusted under 35 U.S.C. 154(b) by 0 days. days.

(21) Appl. No.: 15/380,653

(22) Filed: Dec. 15, 2016

(51) Int. Cl.
*H04L 7/00* (2006.01)
*H04L 1/20* (2006.01)

(52) U.S. Cl.
CPC ............ *H04L 7/0087* (2013.01); *H04L 1/205* (2013.01)

(58) Field of Classification Search
CPC .............................. H04L 7/0087; H04L 1/205
USPC ........................................................ 375/355
See application file for complete search history.

(56) References Cited

U.S. PATENT DOCUMENTS

| | | | |
|---|---|---|---|
| 8,958,517 B2 * | 2/2015 | Su ............................. | H04L 7/02 375/371 |
| 2006/0062341 A1 * | 3/2006 | Edmondson .......... | H03L 7/0814 375/376 |
| 2006/0076993 A1 * | 4/2006 | Teo .......................... | H03K 5/13 327/165 |
| 2009/0086872 A1 * | 4/2009 | Liu ....................... | H03L 7/0814 375/371 |
| 2013/0169328 A1 * | 7/2013 | Shibasaki ............. | H03L 7/0814 327/156 |
| 2014/0254655 A1 * | 9/2014 | Zhong ..................... | H04L 27/01 375/233 |
| 2015/0092898 A1 * | 4/2015 | Lee ....................... | H04L 7/0062 375/354 |
| 2015/0304141 A1 * | 10/2015 | Palmer .................... | H04L 7/041 375/232 |

* cited by examiner

*Primary Examiner* — Helene Tayong
(74) *Attorney, Agent, or Firm* — Robert M. Brush

(57) ABSTRACT

An example method of clock and data recovery in a receiver includes generating data samples and crossing samples of a received signal based on a data clock signal and a crossing clock signal, respectively, which are derived from a sampling clock signal; adjusting a phase of the sampling clock signal using a clock and data recovery (CDR) circuit based on the data samples and the crossing samples; adjusting relative phase between the data clock signal and the crossing clock signal from a first phase difference to a second phase difference that is less than ninety degrees; and reverting the relative phase between the data clock signal and the crossing clock signal to the first phase difference after a threshold time period.

20 Claims, 11 Drawing Sheets

TEMPORAL CHANGE IN DATA-CROSSING CLOCK PHASE DIFFERENCE TO RESOLVE META-STABILITY IN A CLOCK AND DATA RECOVERY CIRCUIT

TECHNICAL FIELD

Examples of the present disclosure generally relate to electronic circuits and, in particular, to a temporal change in data-crossing clock phase difference to resolve meta-stability in a clock and data recovery circuit.

BACKGROUND

High-speed data communication systems frequently rely on clock and data recovery (CDR) circuits within the receiver rather than transmitting a reference clock with the data. For example, serial data communication may include the use of a serializer-deserializer (SERDES) at each end of a communication link. Within a SERDES, a CDR may extract a clock that is embedded in the incoming data stream. Once a clock is recovered, the clock is used to sample the incoming data stream to recover individual bits.

A bang-bang CDR scheme is widely used in digital logic to identify the best clock phase to capture the received data. In a bang-bang CDR scheme, the received signal is over-sampled to obtain data samples and crossing samples (also referred to as edge samples). A bang-bang CDR uses the data samples and the crossing samples to determine if the data sampling phase should be adjusted, in which direction the data sampling phase should be adjusted, and where to stop the adjustment. Once the data sampling phase dithers around the "best" sampling position, the bang-bang CDR is locked.

There is a scenario where the data sampling phase falls at the crossing area when the system starts, which results in a longer time to lock. This condition is referred to as meta-stability. In the meta-stable condition, the phase detector in the CDR may not effectively generate decisive signals to push the CDR to lock quickly. Eventually, the CDR can exit the meta-stable state and lock to the correct phase due to external interference, but the lock times can be long. It is desirable to minimize lock times and avoid meta-stable conditions in a CDR circuit.

SUMMARY

Techniques for temporal change in data-crossing clock phase difference to resolve meta-stability in a clock and data recovery circuit are described. In an example, a method of clock and data recovery in a receiver includes generating data samples and crossing samples of a received signal based on a data clock signal and a crossing clock signal, respectively, which are derived from a sampling clock signal; adjusting a phase of the sampling clock signal using a clock and data recovery (CDR) circuit based on the data samples and the crossing samples; adjusting relative phase between the data clock signal and the crossing clock signal from a first phase difference to a second phase difference that is less than ninety degrees; and reverting the relative phase between the data clock signal and the crossing clock signal to the first phase difference after a threshold time period.

In another example, a receiver includes sampling circuitry configured to generate data samples and crossing samples of a received signal based a data clock signal and a crossing clock signal, respectively, which are derived from a sampling clock signal; a clock and data recovery (CDR) circuit configured to adjust a phase of the sampling clock signal based on the data samples and the crossing samples; and a clock manager circuit configured to adjust a relative phase between the data clock signal and the crossing clock signal from a first phase difference to a second phase difference that is less than ninety degrees, and revert the relative phase between the data clock signal and the crossing clock signal to the first phase difference after a threshold time period.

In another example, an integrated circuit (IC) includes a serializer/deserializer (SerDes) circuit coupled to a transmission channel, and a receiver, disposed in the SerDes circuit, configured to obtain a received signal from the transmission channel. The receiver includes: sampling circuitry configured to generate data samples and crossing samples of the received signal based a data clock signal and a crossing clock signal, respectively, which are derived from a sampling clock signal; a clock and data recovery (CDR) circuit configured to adjust a phase of the sampling clock signal based on the data samples and the crossing samples; and a clock manager circuit configured to adjust a relative phase between the data clock signal and the crossing clock signal from a first phase difference to a second phase difference that is less than ninety degrees, and revert the relative phase between the data clock signal and the crossing clock signal to the first phase difference after a threshold time period.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
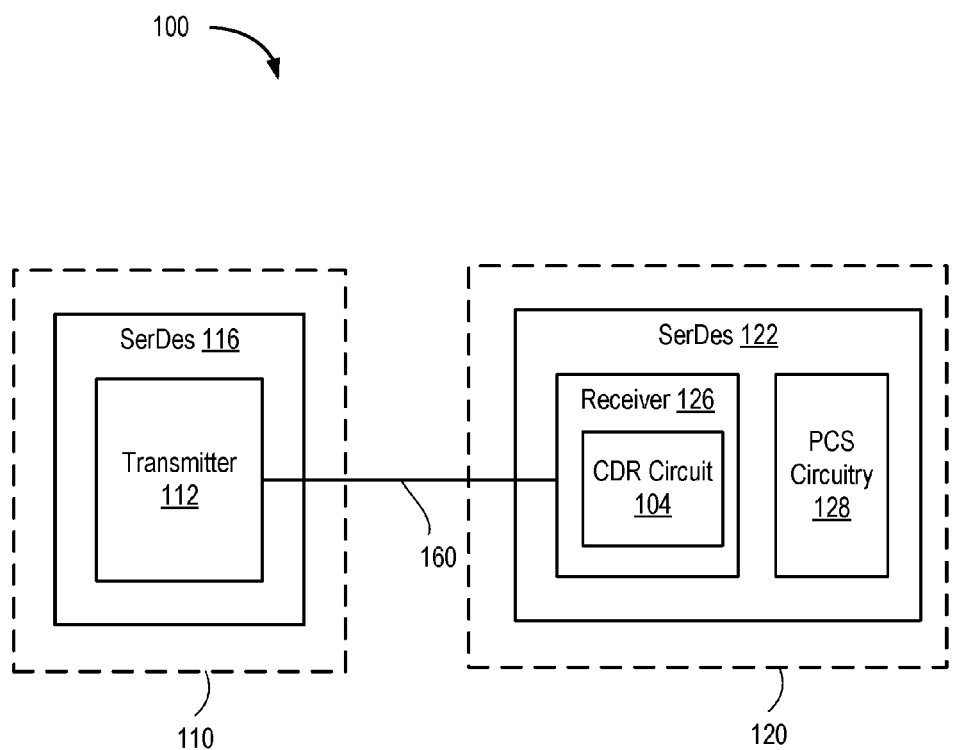
FIG. 1 is a block diagram depicting an example of a serial communication system.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated example need not have all the aspects or advantages shown. An aspect or an advantage described in conjunction with a particular example is not necessarily limited to that example and can be practiced in any other examples even if not so illustrated or if not so explicitly described.

FIG. 1 is a block diagram depicting an example of a serial communication system 100. The serial communication system 100 comprises a transmitter 112 coupled to a receiver 126 over transmission medium 160. The transmitter 112 can be part of a serializer-deserializer (SerDes) 116. The receiver 126 can be part of a SerDes 122. The transmission medium 160 comprises an electrical path between the transmitter 112 and the receiver 126 and can include printed circuit board (PCB) traces, vias, cables, connectors, decoupling capacitors, and the like. The receiver of the SerDes 116, and the transmitter of the SerDes 122, are omitted for clarity. In some examples, the SerDes 116 can be disposed in an integrated circuit (IC) 110, and the SerDes 122 can be disposed in an IC 120.

The transmitter 112 drives serial data onto the transmission medium 160 using a digital baseband modulation technique. In general, the serial data is divided into symbols. The transmitter 112 converts each symbol into an analog voltage mapped to the symbol. The transmitter 112 couples the analog voltage generated from each symbol to the transmission medium 160. In some examples, the transmitter 112 uses a binary non-return-to-zero (NRZ) modulation scheme. In binary NRZ, a symbol is one bit of the serial data and two analog voltages are used to represent each bit. In other examples, the transmitter uses multi-level digital baseband modulation techniques, such as pulse amplitude modulation (PAM), where a symbol includes a plurality of bits of the serial data and more than two analog voltages are used to represent each bit.

The receiver 126 generally includes a clock and data recovery (CDR) circuit 104. The receiver 126 receives an analog signal from the transmission medium 160. The CDR circuit 104 operates to recover data and a clock from the analog signal. The receiver 126 provides the recovered data to physical coding sublayer (PCS) circuitry 128 in SerDes 122 for decoding and further processing.

Figure 2:
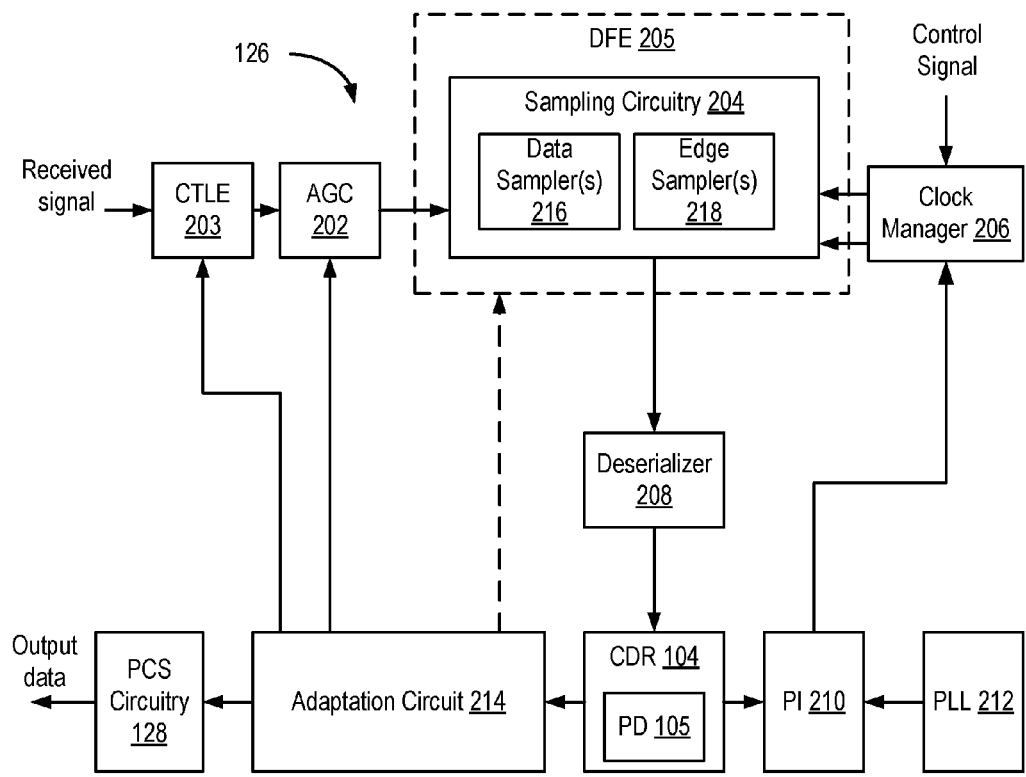
FIG. 2 is a block diagram depicting a receiver according to an example.

FIG. 2 is a block diagram depicting the receiver 126 according to an example. The receiver 126 includes a continuous time linear equalizer (CTLE) 203, an automatic gain control (AGC) circuit 202, sampling circuitry 204, deserializer 208, the CDR circuit 104, a phase interpolator (PI) 210, a clock manager circuit 206, and an adaptation circuit 214. An output of the CTLE 203 is coupled to an input of the AGC circuit 202. An output of the AGC circuit 202 is coupled to inputs of the sampling circuitry 204. An output of the clock manager circuit 206 is coupled to inputs of the sampling circuitry 204. An output the sampling circuitry 204 is coupled to an input of the deserializer 208. An output of the deserializer 208 is coupled to an input of the CDR circuit 104. Outputs of the CDR circuit 104 are coupled to an input of the adaptation circuit 214 and an input of the PI 210, respectively. Another input of the PI 210 is coupled to an output of a phase locked loop (PLL) circuit 212. In an example, an output of the PI 210 is coupled to an input of the clock manager 206. An output of the clock manager 206 is coupled to an input of the sampling circuitry 204. Outputs of the adaptation circuit 214 are coupled to the CTLE 203, the AGC circuit 202, and the PCS circuitry 128, respectively. In an example, the sampling circuitry 204 can be part of a decision feedback equalizer (DFE) 205. In such case, another output of the adaptation circuit 214 is coupled to the DFE 205.

In operation, the CTLE 203 receives an analog signal from the transmission medium 160. The CTLE 203 operates as a high-pass filter to compensate for the low-pass characteristics of the transmission medium 160. The peak of the frequency response of the CTLE 203 can be adjusted based on a CTLE adjust signal provided by the adaptation circuit 214. The AGC circuit 202 receives the equalized analog signal from the CTLE 203. The AGC circuit 202 adjusts the gain of the equalized signal based on a gain adjust signal provided by the adaptation circuit 214. In another example, the AGC circuit 202 can precede the CTLE circuit 203.

The sampling circuitry 204 generates data and crossing samples from the output of the AGC circuit 202 based on a sampling clock signal supplied by the PI 210. The sampling circuitry 204 can generate the data samples using a data sampling clock and the crossing samples using a crossing sampling clock. In an example, the clock manager 206 is configured to generate the data sampling clock and the crossing sampling clock from the sampling clock output by the PI 210. In another example, the function of the clock manager 206 can be incorporated into the PI 210. The clock manager 206 can also reduce the frequency of the sampling clock signal supplied by the PI 210. In example, the sampling circuitry 204 is part of the DFE 205. The DFE 205 equalizes the output of the AGC circuit 202 to minimize inter-symbol interference (ISI). The sampling circuitry 204 can include one or more data samplers 216 configured to generate data samples based on the data sampling clock, and one or more edge samplers 218 configured to generate crossing samples based on the crossing sampling clock.

Each data and crossing sample includes one or more bits depending on the type of modulation scheme employed (e.g., one bit samples for binary NRZ and multi-bit samples for PAM). The deserializer 208 groups data samples and crossing samples to generate a deserialized signal. The deserializer 208 unifies the two separate parallel data and crossing sample streams into a deserialized signal to be processed by the CDR circuit 104.

The CDR circuit 104 generates a PI code signal from the deserialized signal generated by the deserializer 208. The PI 210 receives a reference clock signal from the PLL 212. The PI 210 shifts the phase of the reference clock signal based on the PI code signal output by the CDR circuit 104. The PI 210 outputs the phase-shifted reference clock signal as the sampling clock signal.

The CDR circuit 104 outputs a data signal to the adaptation circuit 214. The data signal includes the data samples output by the sampling circuitry 204. The adaptation circuit 214 generates control signals for the CTLE 203 and the AGC circuit 202 based on data signal using known algorithms. If the DFE 205 is present, the adaptation circuit 214 generates a control signal for adjusting the taps of the DFE 205 using a known algorithm. The adaptation circuit 214 outputs the data signal to the PCS circuitry 128. The PCS circuitry 128 processes the data signal to recover the transmitted data.

Figure 3:
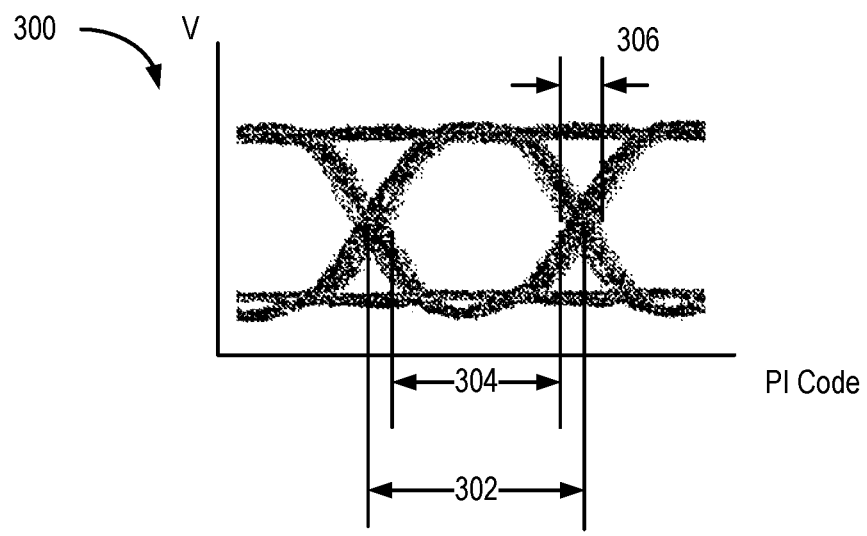
FIG. 3 is a plot of an eye diagram according to an example.

FIG. 3 is a plot of an eye diagram 300 according to an example. The eye diagram 300 includes a vertical axis representing voltage (V) of the received signal and a horizontal axis representing PI code (e.g., sampling phase). The eye diagram 300 shows an eye 302 that includes an eye opening 304 and a crossing region 306. For the best margin, it is desirable to capture data by placing the data sampling phase and the crossing sampling phase at the centers of the eye opening 504 and the crossing region 506, respectively.

In an example, the CDR circuit 104 includes a phase detector (PD) 105. The phase detector 105 determines whether to adjust the data sampling phase and in which direction the data sampling phase should be adjusted. In an example, the phase detector 105 includes at least one bang-bang phase detector each operating on a pair of data bits and a crossing bit. A bang-bang phase detector operates according to the following truth table:

TABLE 1

| Current Bit | Crossing Bit | Next Bit | Processing |
|---|---|---|---|
| 0 | 1 | 1 | Data sampling phase is late, needs to move left |
| 1 | 0 | 0 | Data sampling phase is late, needs to move left |
| 0 | 0 | 1 | Data sampling phase is early, needs to move right |
| 1 | 1 | 0 | Data sampling phase is early, needs to move right |

The phase detector 105 generates a phase detect result signal. The phase detect result signal provides a net phase detect result from the bang-bang phase detectors.

Figure 4A:
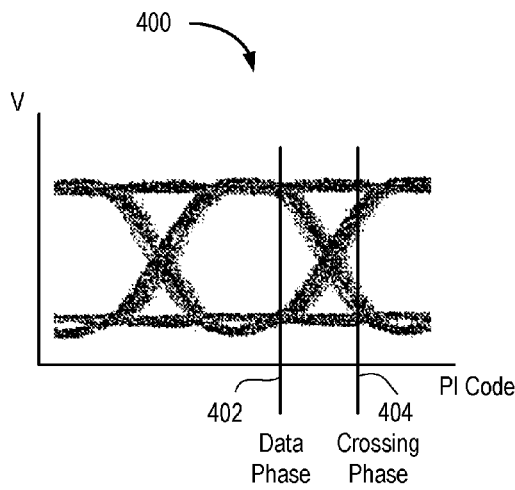
FIG. 4A is a plot of an eye diagram showing an example where the data sampling phase is late.
Figure 4B:
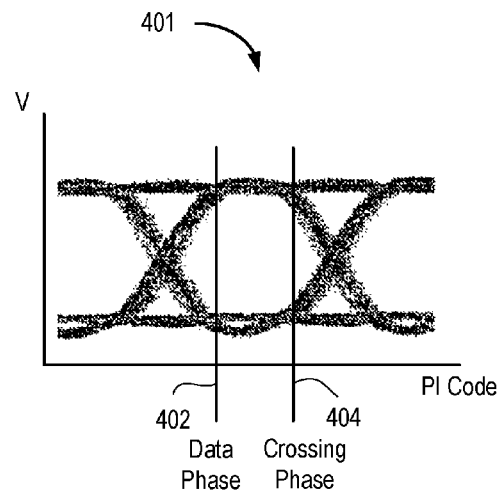
FIG. 4B is a plot of an eye diagram showing an example where the data sampling phase is early.

FIG. 4A is a plot of an eye diagram 400 showing an example where the data sampling phase is late. As shown in FIG. 4A, a data sampling phase 402 is disposed to the right of the center of the data eye. Likewise, a crossing sampling phase 404 is disposed to the right of the crossing region. FIG. 4B is a plot of an eye diagram 401 showing an example where the data sampling phase is early. As shown in FIG. 4B, the data sampling phase 402 is disposed to the left of the center of the data eye. Likewise, the crossing sampling phase 404 is disposed to the left of the crossing region.

Figure 5A:
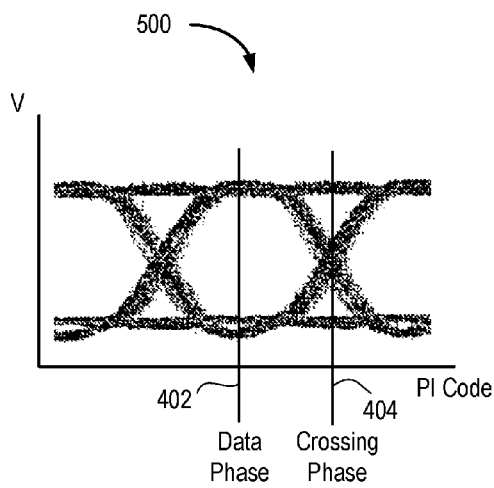
FIG. 5A is a plot of an eye diagram showing an example where the data sampling phase is in the center of the data eye.
Figure 5B:
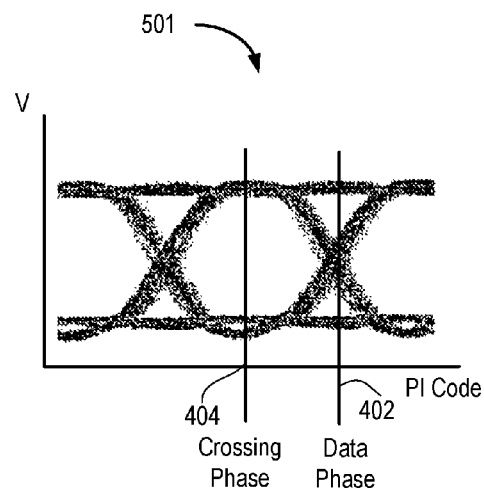
FIG. 5B is a plot of an eye diagram showing an example where the data sampling phase and the crossing sampling phase are flipped.

In the scenarios of FIGS. 4A and 4B, the phase detector 105 can detect the early and late conditions and the CDR circuit 104 can adjust the PI code to achieve the correct data sampling phase (e.g., the center of the data eye). FIG. 5A is a plot of an eye diagram 500 showing an example where the data sampling phase is in the center of the data eye. As shown in FIG. 5A, the data sampling phase 402 is disposed in the center of the data eye and the crossing sampling phase 404 is disposed in the crossing region. In such a scenario, the CDR circuit 104 is considered locked. The data sampling phase then dithers around the locked position once lock is achieved. It is possible when the receiver is powered that the data and crossing sampling phases are flipped, as shown in FIG. 5B. FIG. 5B is a plot of an eye diagram 501 showing an example where the data sampling phase 402 and the crossing sampling phase 404 are flipped. In such case, the crossing sampling phase 404 is disposed in the center of the data eye, and the data sampling phase 402 is disposed in the crossing region. This scenario is referred to as a meta-stable condition.

In the meta-stable condition, without the compensation technique described herein, the CDR circuit 104 may not be able to make a decisive decision to move the data sampling phase to the locking position within a threshold time, which extends the locking time even with data transitions. An external disturbance will eventually make the CDR circuit 104 transition out of the meta-stable state and to the locked state. However, the extended locking time is deleterious, especially for locking-time sensitive applications.

Figure 6:
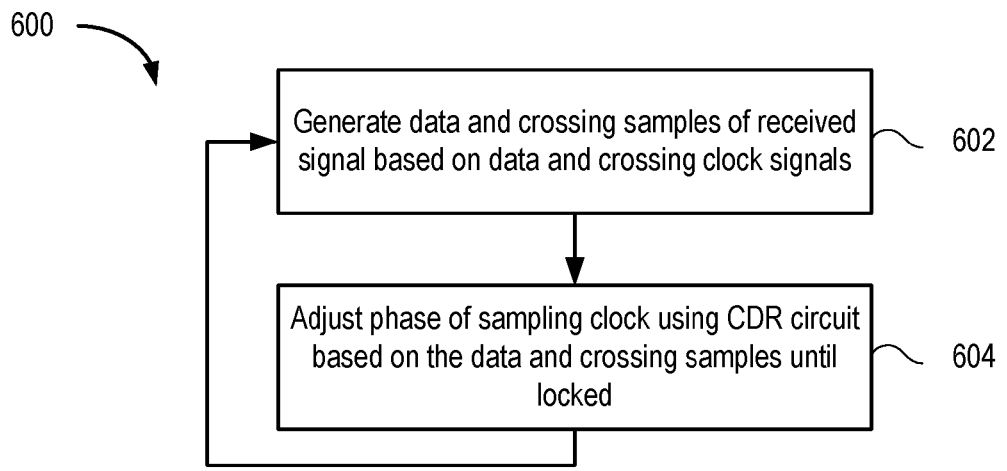
FIG. 6 is a flow diagram depicting a method of clock and data recovery according to an example.

FIG. 6 is a flow diagram depicting a method 600 of clock and data recovery according to an example. The method 600 begins at step 602, where the sampling circuitry 204 generates data and crossing samples of a received signal based on data and crossing clock signals, respectively. As noted above, the data and crossing clock signals are derived from a sampling clock that is generated by the PI 210 based on control implemented by the CDR 104. At step 604, the CDR circuit 104 adjusts the phase of the sampling clock based on the data and crossing samples until the CDR circuit 104 is locked. As described above, the CDR circuit 104 generates PI codes for controlling the PI 210, which adjusts the phase of a reference clock output by the PLL 212 to generate the sampling clock. The PD 105 of the CDR 104 can be one or more bang-bang phase detectors configured to determine phase error based on a current data sample, a current crossing sample, and a next data sample. The steps of generating samples and adjusting the sampling clock are performed continuously over time.

Figure 7:
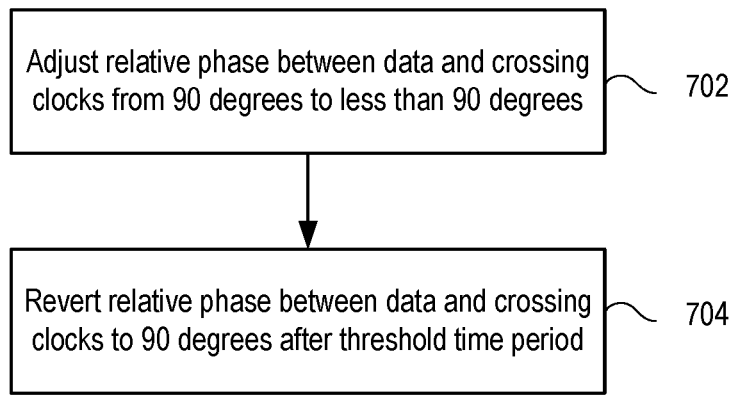
FIG. 7 is a flow diagram depicting a method of managing a sampling clock according to an example.

FIG. 7 is a flow diagram depicting a method 700 of managing a sampling clock according to an example. The method 700 is performed during the method 600 of clock and data recovery discussed above. The method 700 begins at step 702, where the clock manager 206 adjusts the relative phase between the data and crossing clocks from a standard phase difference (also referred to as a first phase difference) to a shifted phase difference (also referred to as a second phase difference). In an example, the standard phase difference is ninety degrees or substantially ninety degrees. That is, with the standard phase difference, the data sampling clock and the crossing sampling clock are in quadrature with one another. In an example, the shifted phase difference is less than ninety degrees. In a non-limiting example, the shifted phase difference is substantially forty-five degrees. However, in other examples, the shifted phase difference can have other values less than ninety degrees. The clock manager 206 can include a control input that is used to set the value of the shifted phase difference and the duration of the shift.

At step 704, the clock manager 206 reverts the relative phase between the data and sampling clocks to the standard phase difference after a threshold time period. For example, the clock manager 206 can revert back to a substantially ninety degree phase difference between the data and sampling clocks. The value of the threshold time period can be set by the control input to the clock manager 206. In an example, the threshold time period is at least a long as the lock time of the CDR circuit 104. In an example, the clock manager 206 can perform steps 702 and 704 a plurality of times until the CDR achieves a locked state.

Figure 8A:
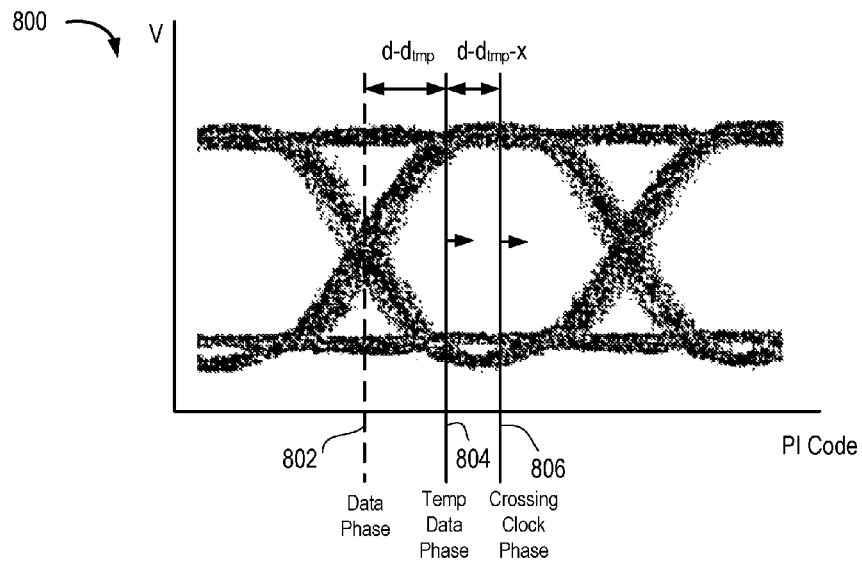
FIGS. 8A-8C show example eye diagrams corresponding to the method of FIG. 7 described above for an initial metastable condition.
Figure 8B:
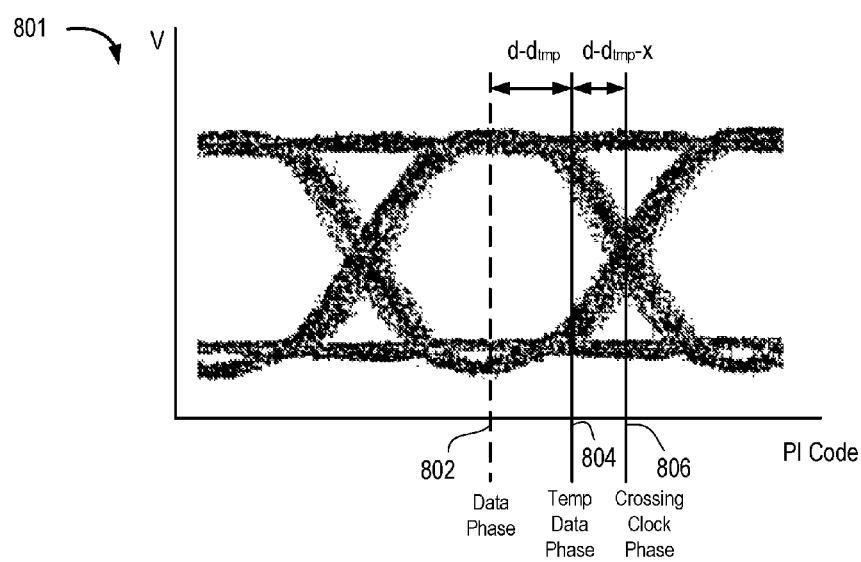
Figure 8C:
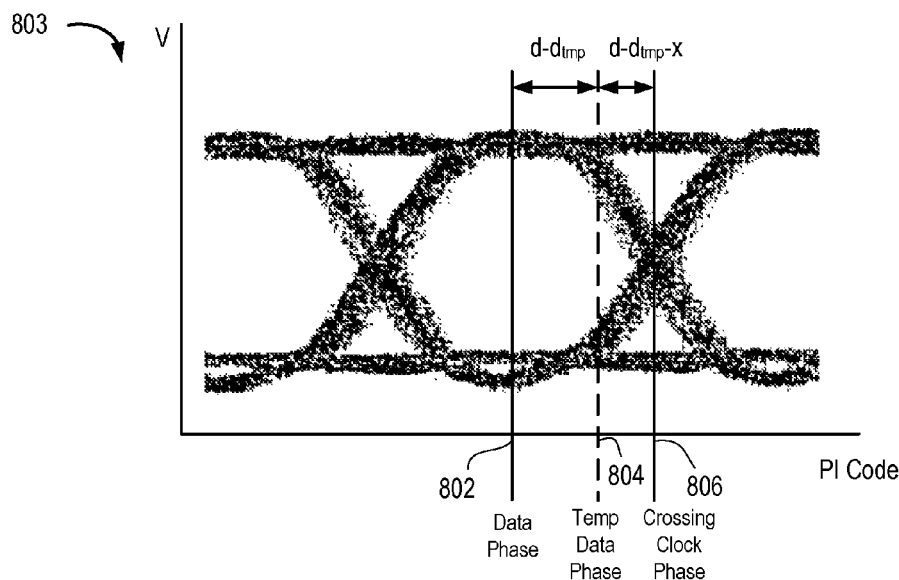

FIGS. 8A-8C show example eye diagrams corresponding to the method 700 described above for an initial metastable condition. As shown in plot 801 of FIG. 8A, a data sampling phase 802 is initially at the crossing region and a crossing clock phase 806 is initially at the center of the data eye. After execution of step 702, the data sampling phase is shifted, resulting in a temporary data clock phase 804. That is, the relative phase between the data sampling clock and the crossing sampling clock is set to be less than ninety degrees. The phase of the data sampling clock is shifted by a value $d-d_{tmp}$. The phase difference between the temporary data sampling clock 804 and the crossing sampling clock 806 is a value $d-d_{tmp}$-x.

During the temporary phase shift, the CDR circuit 104 will operate to adjust the sampling clock to move the crossing clock phase 806 towards the crossing region. This is shown in plot 801 of FIG. 8B, where the CDR circuit 104 has reached the lock condition. As shown in plot 803 of FIG. 8C, the clock manager 206 reverts the relative phase between the data and crossing sampling clocks to the standard phase difference. The data phase 802 is at the center of the data eye, and the crossing clock phase 806 is at the crossing region. Thus, the receiver has exited the metastable condition.

Figure 9A:
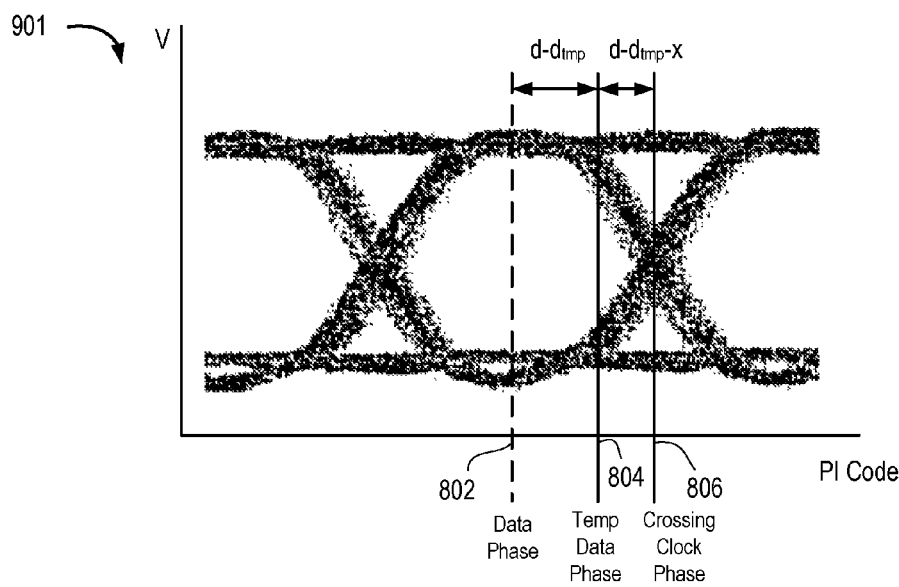
FIGS. 9A-9C show example eye diagrams corresponding to the method of FIG. 7 described above for an initial locked condition.
Figure 9B:
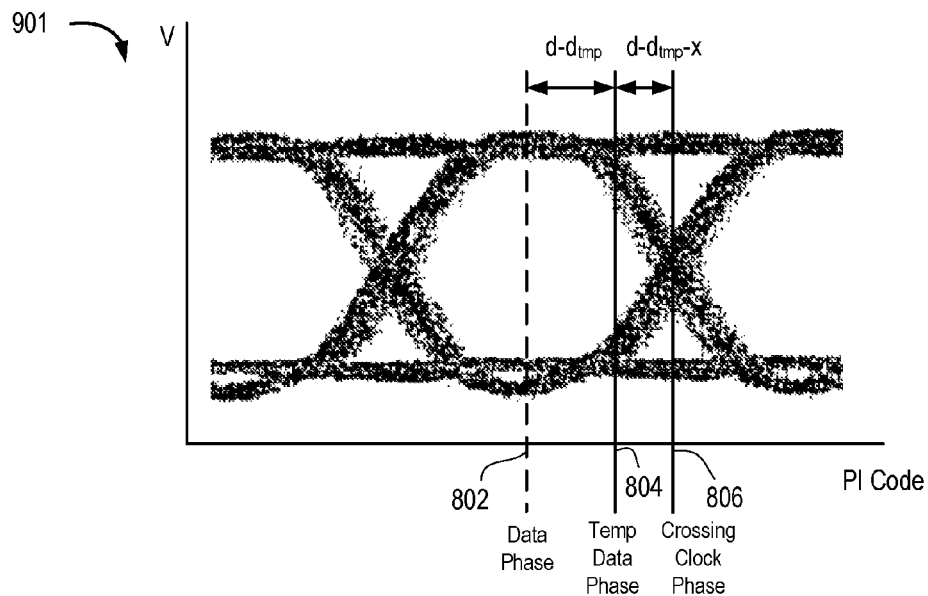
Figure 9C:
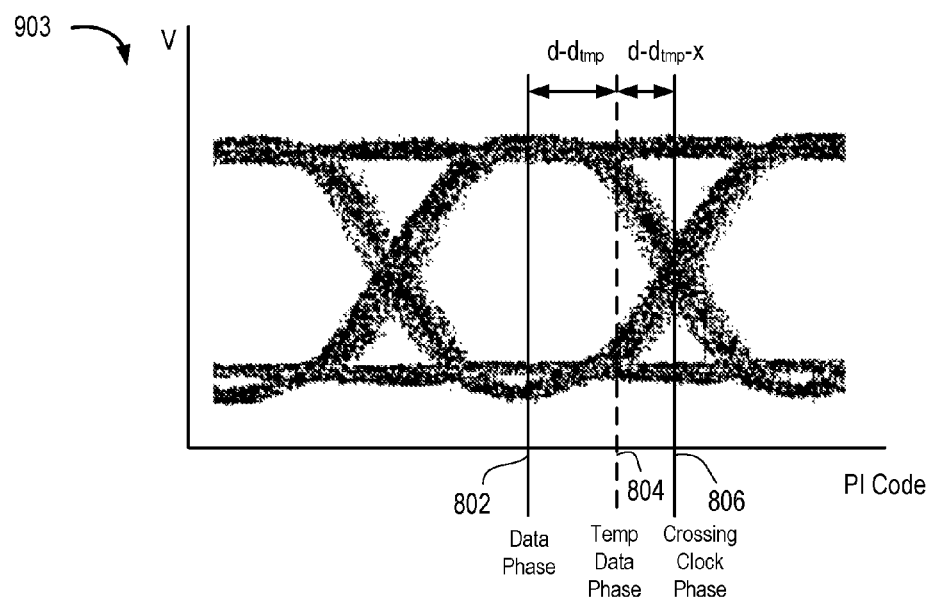

FIGS. 9A-9C show example eye diagrams corresponding to the method 700 described above for an initial locked condition. If the CDR circuit 104 is initially locked (and not in the metastable condition), the data phase 802 is at the center of the data eye and the crossing phase 806 is at the crossing region. After execution of step 702, the temporary data phase 804 is shifted from the center of the data eye towards the crossing region. This is shown in a plot 900 of FIG. 9A. As shown in the plot 901 of FIG. 9B, the CDR circuit 104 operates to adjust the sampling clock to maintain the crossing clock phase 806 at the crossing region. As shown in the plot 903 of FIG. 9C, the clock manager 206 reverts the relative phase between the data and crossing sampling clocks to the standard phase difference. The data phase 802 is at the center of the data eye, and the crossing clock phase 806 is at the crossing region. Thus, the receiver has stayed in the locked condition.

Figure 10A:
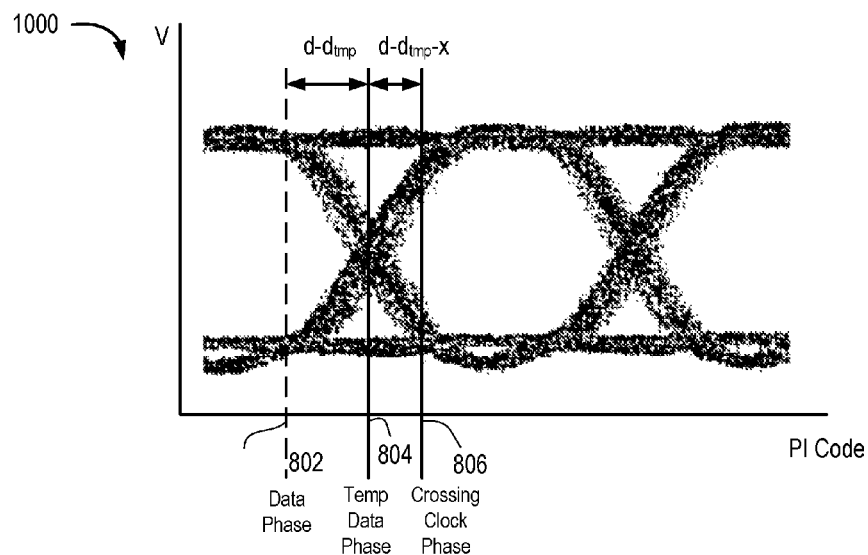
FIGS. 10A-10C show example eye diagrams corresponding to the method of FIG. 7 described above for an initial worse case condition.
Figure 10B:
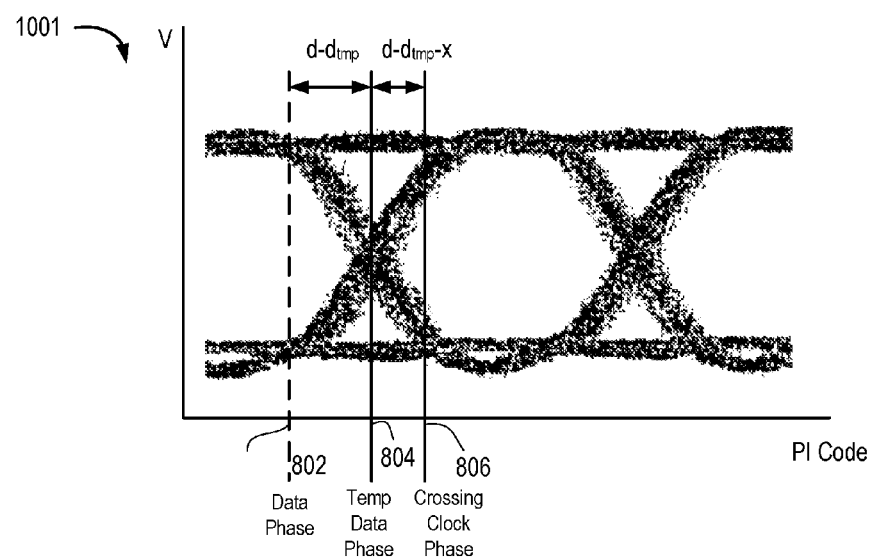
Figure 10C:
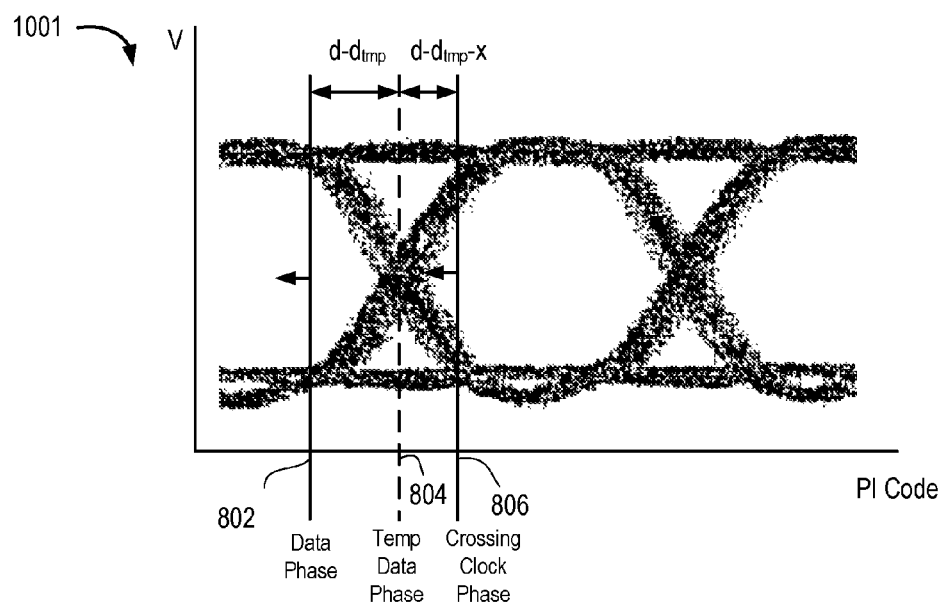

FIGS. 10A-10C show example eye diagrams corresponding to the method 700 described above for an initial worse case condition. As shown in a plot 1000 of FIG. 10A, the temporary shift of the data phase puts the temporary data phase 804 at the crossing region. That is, the temporary phase shift operation results in a metastable condition. As shown in a plot 1001 of FIG. 10B, the CDR circuit 104 remains in the metastable condition during the re-lock phase. As shown in a plot 1003 of FIG. 10C, after step 704, the CDR circuit 104 will operate to shift the data phase 802 to the center of the data eye and the crossing phase 806 to the crossing region naturally.

In view of the above examples, it is shown that the data sampling clock is perturbed to cause a disturbance to an initial metastable condition. If the initial condition is the locked condition, perturbing the data sampling clock phase would not affect the lock. The probability of shifting the data clock phase to cause a metastable condition is small, but not impossible. However, even though there is a metastable state during the temporary shift of the data sampling phase, the CDR circuit 104 will exit the metastable state after reversion to the standard data sampling phase.

The time allowed for re-locking (i.e., the threshold time period in step 704) can be long enough for the CDR circuit 104 to lock. The $d_{tmp}$-x phase difference (i.e., the phase difference between the temporary data clock phase and the crossing clock phase) can be small. In an example, the $d_{tmp}$-x phase difference is wider than the transition jitter width of the received signal so that it is stable in the locked condition. A smaller $d_{tmp}$-x phase difference results in an increased likelihood of the CDR circuit 104 remaining stuck in the metastable condition after the initial perturbation of the data sampling phase. This is because the phase detector gain is smaller around the transition region when the phase difference $d_{tmp}$-x is small. The closer the crossing clock is to the middle of the transitions, the smaller the phase detector gain. A large $d_{tmp}$-x is more likely to force the CDR circuit 104 out of the metastable condition.

In summary, an initial perturbation of the data sampling clock phase (step 702) will operate to force the CDR circuit 104 out of a metastable condition. In the low likelihood that the initial perturbation of the data sampling clock phase shifts the CDR circuit 104 into a metastable condition, a smaller phase difference $d_{tmp}$-x can lengthen the metastable condition, allowing the reversion of the data sampling clock phase to the standard phase to move the CDR circuit 104 out of metastability.

Figure 11:
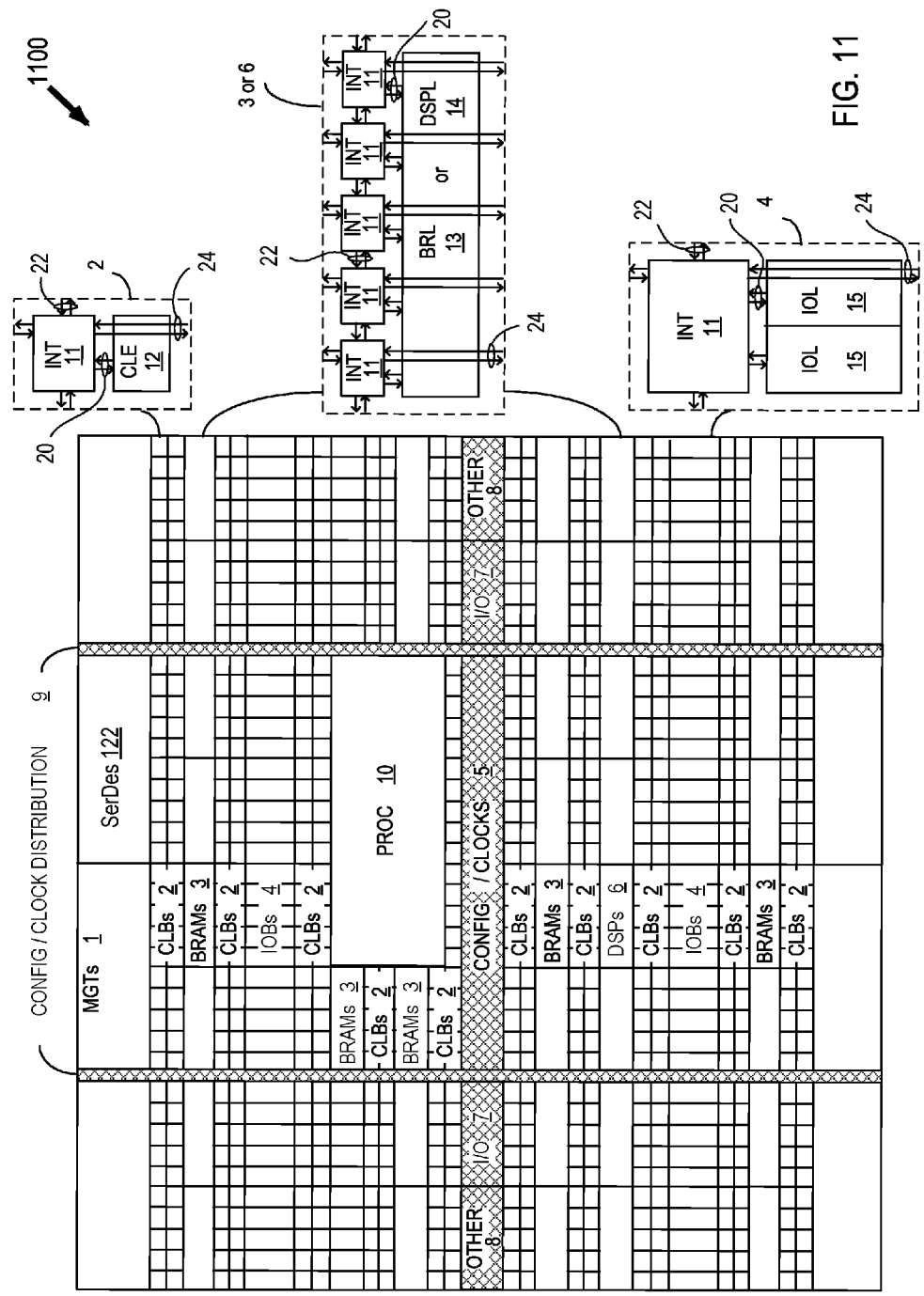
FIG. 11 illustrates an architecture of field programmable gate array in which example receivers described herein can be employed.

The SerDes 122 described above can be implemented within an integrated circuit, such as a field programmable gate array (FPGA) or like type programmable circuit. FIG. 11 illustrates an architecture of FPGA 1100 that includes a large number of different programmable tiles including multi-gigabit transceivers ("MGTs") 1, configurable logic blocks ("CLBs") 2, random access memory blocks ("BRAMs") 3, input/output blocks ("IOBs") 4, configuration and clocking logic ("CONFIG/CLOCKS") 5, digital signal processing blocks ("DSPs") 6, specialized input/output blocks ("I/O") 7 (e.g., configuration ports and clock ports), and other programmable logic 8 such as digital clock managers, analog-to-digital converters, system monitoring logic, and so forth. Some FPGAs also include dedicated processor blocks ("PROC") 10. FPGA 1100 can include one or more instances of SerDes 122 described above.

In some FPGAs, each programmable tile can include at least one programmable interconnect element ("INT") 11 having connections to input and output terminals 20 of a programmable logic element within the same tile, as shown by examples included at the top of FIG. 11. Each programmable interconnect element 11 can also include connections to interconnect segments 22 of adjacent programmable interconnect element(s) in the same tile or other tile(s). Each programmable interconnect element 11 can also include connections to interconnect segments 24 of general routing resources between logic blocks (not shown). The general routing resources can include routing channels between logic blocks (not shown) comprising tracks of interconnect segments (e.g., interconnect segments 24) and switch blocks (not shown) for connecting interconnect segments. The interconnect segments of the general routing resources (e.g., interconnect segments 24) can span one or more logic blocks. The programmable interconnect elements 11 taken together with the general routing resources implement a programmable interconnect structure ("programmable interconnect") for the illustrated FPGA.

In an example implementation, a CLB 2 can include a configurable logic element ("CLE") 12 that can be programmed to implement user logic plus a single programmable interconnect element ("INT") 11. A BRAM 3 can include a BRAM logic element ("BRL") 13 in addition to one or more programmable interconnect elements. Typically, the number of interconnect elements included in a tile depends on the height of the tile. In the pictured example, a BRAM tile has the same height as five CLBs, but other numbers (e.g., four) can also be used. A DSP tile 6 can include a DSP logic element ("DSPL") 14 in addition to an appropriate number of programmable interconnect elements. An 10B 4 can include, for example, two instances of an input/output logic element ("IOL") 15 in addition to one instance of the programmable interconnect element 11. As will be clear to those of skill in the art, the actual I/O pads connected, for example, to the I/O logic element 15 typically are not confined to the area of the input/output logic element 15.

In the pictured example, a horizontal area near the center of the die (shown in FIG. 11) is used for configuration, clock, and other control logic. Vertical columns 9 extending from this horizontal area or column are used to distribute the clocks and configuration signals across the breadth of the FPGA.

Some FPGAs utilizing the architecture illustrated in FIG. 11 include additional logic blocks that disrupt the regular columnar structure making up a large part of the FPGA. The additional logic blocks can be programmable blocks and/or dedicated logic. For example, processor block 10 spans several columns of CLBs and BRAMs. The processor block 10 can various components ranging from a single microprocessor to a complete programmable processing system of microprocessor(s), memory controllers, peripherals, and the like.

Note that FIG. 11 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 11 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

While the foregoing is directed to specific examples, other and further examples may be devised without departing from the basic scope thereof, and the scope thereof is determined by the claims that follow.

What is claimed is:

1. A method of clock and data recovery in a receiver, comprising:
   generating data samples and crossing samples of a received signal based on a data clock signal and a crossing clock signal, respectively, which are derived from a sampling clock signal by a clock manager circuit;
   adjusting a phase of the sampling clock signal using a clock and data recovery (CDR) circuit based on the data samples and the crossing samples;
   adjusting, using the clock manager circuit relative phase between the data clock signal and the crossing clock signal from a first phase difference to a second phase difference that is less than ninety degrees; and
   reverting, using the clock manager circuit, the relative phase between the data clock signal and the crossing clock signal to the first phase difference after a threshold time period.

2. The method of claim 1, wherein the first phase difference is substantially ninety degrees.

3. The method of claim 1, wherein the second phase difference is substantially forty-five degrees.

4. The method of claim 1, wherein the second phase difference is larger than a transition jitter width of the received signal.

5. The method of claim 1, wherein the CDR circuit includes a bang-bang phase detector, and wherein the step of adjusting the phase of the sampling clock comprises operating on a current data sample, a current crossing sample, and a next data sample at the bang-bang phase detector.

6. The method of claim 1, wherein the threshold time period is at least as long as a lock period of the CDR circuit.

7. The method of claim 1, further comprising:
   repeating the steps of adjusting and reverting at least one additional time.

8. A receiver, comprising:
   sampling circuitry configured to generate data samples and crossing samples of a received signal based on a data clock signal and a crossing clock signal, respectively, which are derived from a sampling clock signal;
   a clock and data recovery (CDR) circuit configured to adjust a phase of the sampling clock signal based on the data samples and the crossing samples; and
   a clock manager circuit configured to adjust a relative phase between the data clock signal and the crossing clock signal from a first phase difference to a second phase difference that is less than ninety degrees, and revert the relative phase between the data clock signal and the crossing clock signal to the first phase difference after a threshold time period.

9. The receiver of claim 8, wherein the first phase difference is substantially ninety degrees.

10. The receiver of claim 8, wherein the second phase difference is substantially forty-five degrees.

11. The receiver of claim 8, wherein the second phase difference is larger than a transition jitter width of the received signal.

12. The receiver of claim 8, wherein the CDR circuit includes a bang-bang phase detector, and wherein the bang-bang phase detector is configured to adjust the phase of the sampling clock comprises operating on a current data sample, a current crossing sample, and a next data sample at the bang-bang phase detector.

13. The receiver of claim 8, wherein the threshold time period is at least as long as a lock period of the CDR circuit.

14. The receiver of claim 8, wherein the clock manager circuit is configured to adjust and revert the relative phase a plurality of times.

15. An integrated circuit (IC), comprising:
   a serializer/deserializer (SerDes) circuit coupled to a transmission channel; and
   a receiver, disposed in the SerDes circuit, configured to obtain a received signal from the transmission channel, the receiver including:
      sampling circuitry configured to generate data samples and crossing samples of the received signal based on a data clock signal and a crossing clock signal, respectively, which are derived from a sampling clock signal;
      a clock and data recovery (CDR) circuit configured to adjust a phase of the sampling clock signal based on the data samples and the crossing samples; and
      a clock manager circuit configured to adjust a relative phase between the data clock signal and the crossing clock signal from a first phase difference to a second phase difference that is less than ninety degrees, and revert the relative phase between the data clock signal and the crossing clock signal to the first phase difference after a threshold time period.

16. The IC of claim 15, wherein the first phase difference is substantially ninety degrees.

17. The IC of claim 15, wherein the second phase difference is substantially forty-five degrees.

18. The IC of claim 15, wherein the second phase difference is larger than a transition jitter width of the received signal.

19. The IC of claim 15, wherein the CDR circuit includes a bang-bang phase detector, and wherein the bang-bang phase detector is configured to adjust the phase of the sampling clock comprises operating on a current data sample, a current crossing sample, and a next data sample at the bang-bang phase detector.

20. The IC of claim 15, wherein the threshold time period is at least as long as a lock period of the CDR circuit.

* * * * *